US012653005B2

(12) United States Patent
Chou

(10) Patent No.: US 12,653,005 B2
(45) Date of Patent: Jun. 9, 2026

(54) SEMICONDUCTOR DEVICE STRUCTURE WITH PATTERNS HAVING COPLANAR BOTTOM SURFACES AND METHOD FOR PREPARING THE SAME

(71) Applicant: NANYA TECHNOLOGY CORPORATION, New Taipei City (TW)

(72) Inventor: Liang-Pin Chou, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 474 days.

(21) Appl. No.: 18/221,539

(22) Filed: Jul. 13, 2023

(65) Prior Publication Data

US 2024/0128084 A1    Apr. 18, 2024

Related U.S. Application Data

(62) Division of application No. 17/964,249, filed on Oct. 12, 2022.

(51) Int. Cl.
H10P 76/40 (2026.01)

(52) U.S. Cl.
CPC ........ H10P 76/4085 (2026.01); H10P 76/405 (2026.01)

(58) Field of Classification Search
CPC ............. H01L 21/0337; H01L 21/0332; H01L 21/0276
See application file for complete search history.

(56) References Cited

U.S. PATENT DOCUMENTS

| | | | |
|---|---|---|---|
| 2006/0046200 A1* | 3/2006 | Abatchev | H10P 50/691 257/E21.314 |
| 2016/0203983 A1* | 7/2016 | Kim | H10P 76/4085 438/695 |
| 2021/0294216 A1* | 9/2021 | Dai | H01L 21/0273 |
| 2022/0293419 A1* | 9/2022 | Lu | H10P 50/283 |

FOREIGN PATENT DOCUMENTS

| | | |
|---|---|---|
| TW | I366864 B | 6/2012 |
| TW | 201714208 A | 4/2017 |
| TW | 202232760 A | 8/2022 |

OTHER PUBLICATIONS

Office Action mailed on Jan. 17, 2024 related to Taiwanese Application No. 112146862.
Office Action and and the search report mailed on Aug. 14, 2025 related to U.S. Appl. No. 17/964,249, wherein this application is a Div of U.S. Appl. No. 17/964,249.

(Continued)

*Primary Examiner* — Marlon T Fletcher
*Assistant Examiner* — Samuel Jonathan Smith
(74) *Attorney, Agent, or Firm* — Xuan Zhang

(57) ABSTRACT

A semiconductor device structure includes a first hard mask pattern disposed over a metal layer. The semiconductor device structure also includes a second hard mask pattern disposed over the metal layer and spaced apart from the first hard mask pattern. A bottom surface of the first hard mask pattern is coplanar with a bottom surface of the second hard mask pattern.

5 Claims, 11 Drawing Sheets

(56)　　　　　　　References Cited

OTHER PUBLICATIONS

Office Action and and the search report mailed on Oct. 23, 2025
related to U.S. Appl. No. 17/964,249, wherein this application is a
Div of U.S. Appl. No. 17/964,249.
Office Action and and the search report mailed on Apr. 24, 2025
related to U.S. Appl. No. 17/964,249, wherein this application is a
Div of U.S. Appl. No. 17/964,249.
Office Action and and the search report mailed on Dec. 31, 2025
related to U.S. Appl. No. 17/964,249, wherein this application is a
Div of U.S. Appl. No. 17/964,249.

* cited by examiner

10

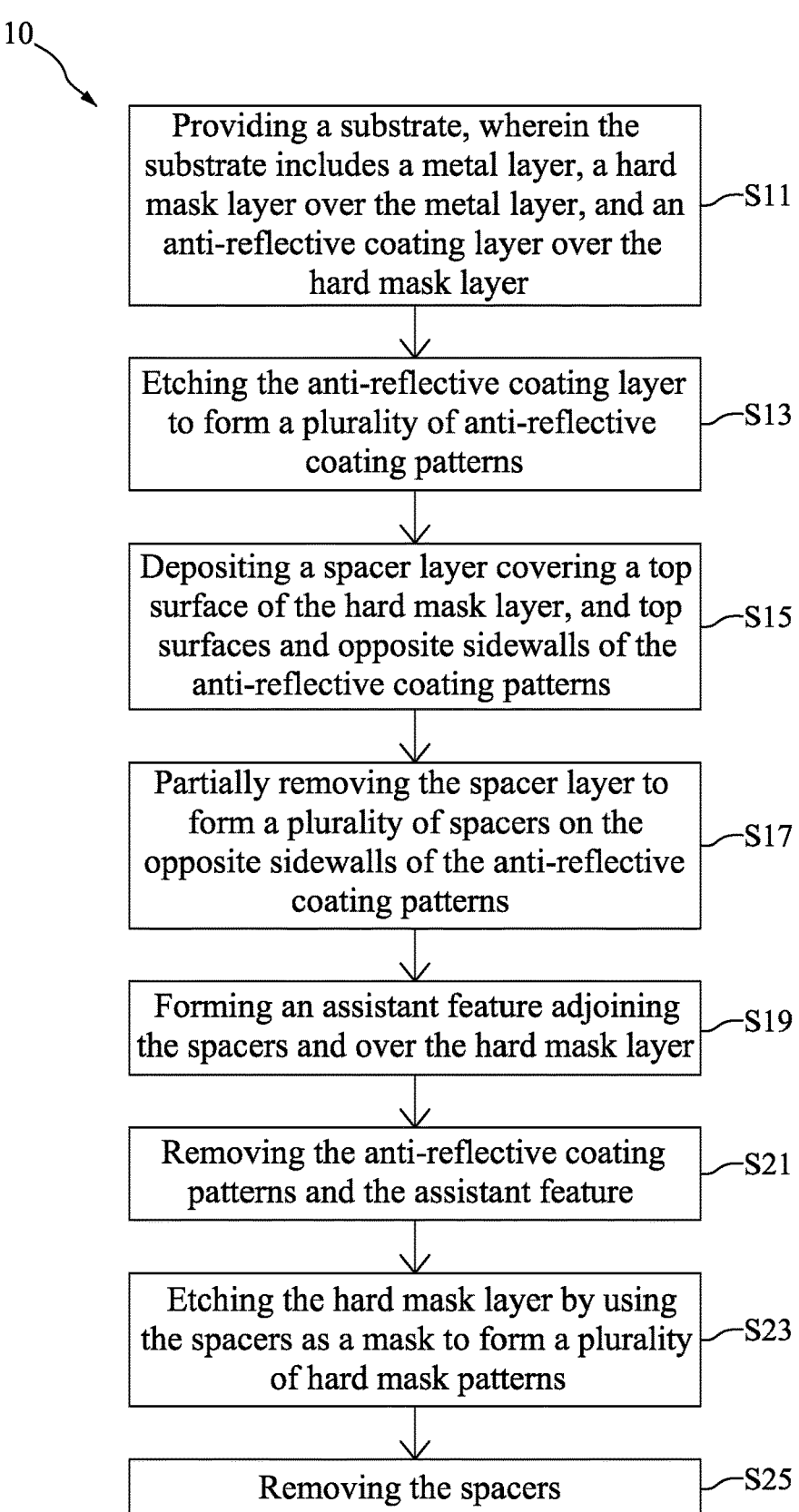

Providing a substrate, wherein the substrate includes a metal layer, a hard mask layer over the metal layer, and an anti-reflective coating layer over the hard mask layer ⟋—S11

Etching the anti-reflective coating layer to form a plurality of anti-reflective coating patterns ⟋—S13

Depositing a spacer layer covering a top surface of the hard mask layer, and top surfaces and opposite sidewalls of the anti-reflective coating patterns ⟋—S15

Partially removing the spacer layer to form a plurality of spacers on the opposite sidewalls of the anti-reflective coating patterns ⟋—S17

Forming an assistant feature adjoining the spacers and over the hard mask layer ⟋—S19

Removing the anti-reflective coating patterns and the assistant feature ⟋—S21

Etching the hard mask layer by using the spacers as a mask to form a plurality of hard mask patterns ⟋—S23

Removing the spacers ⟋—S25

FIG. 2

SEMICONDUCTOR DEVICE STRUCTURE WITH PATTERNS HAVING COPLANAR BOTTOM SURFACES AND METHOD FOR PREPARING THE SAME

CROSS-REFERENCE TO RELATED APPLICATION

This application is a divisional application of U.S. Non-Provisional application Ser. No. 17/964,249 filed 12 Oct. 2022, which is incorporated herein by reference in its entirety.

TECHNICAL FIELD

The present disclosure relates to a semiconductor device structure and a method for preparing the same, and more particularly, to a semiconductor device structure with patterns having coplanar bottom surfaces and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first hard mask pattern disposed over a metal layer. The semiconductor device structure also includes a second hard mask pattern disposed over the metal layer and spaced apart from the first hard mask pattern. A bottom surface of the first hard mask pattern is coplanar with a bottom surface of the second hard mask pattern.

In an embodiment, the bottom surface of the first hard mask pattern and the bottom surface of the second hard mask pattern are in direct contact with a top surface of the metal layer. In an embodiment, the metal layer is exposed by an opening between the first hard mask pattern and the second hard mask pattern. In an embodiment, a material of the first hard mask pattern is the same as a material of the second hard mask pattern. In an embodiment, the first hard mask pattern and the second hard mask pattern includes carbon.

In an embodiment, the semiconductor device structure further includes a third hard mask pattern disposed over the metal layer, wherein the second hard mask pattern is disposed between the first hard mask pattern and the third hard mask pattern, and the third hard mask pattern is spaced apart from the second hard mask pattern. In addition, a bottom surface of the third hard mask pattern is coplanar with the bottom surface of the second hard mask pattern. In an embodiment, the first hard mask pattern, the second hard mask pattern, and the third hard mask pattern include carbon.

In another embodiment of the present disclosure, a method for preparing a semiconductor device structure is provided. The method includes providing a substrate. The substrate includes a metal layer, a hard mask layer over the metal layer, and an anti-reflective coating layer over the hard mask layer. The method also includes etching the anti-reflective coating layer to form an anti-reflective coating pattern, and forming a first spacer and a second spacer on opposite sidewalls of the anti-reflective coating pattern. The method further includes forming an assistant feature adjoining the first spacer and the second spacer and over the hard mask layer, and removing the anti-reflective coating pattern and the assistant feature. In addition, the method includes etching the hard mask layer by using the first spacer and the second spacer as a mask to form a first hard mask pattern and a second hard mask pattern.

In an embodiment, a top surface of the metal layer is exposed by an opening between the first hard mask pattern and the second hard mask pattern after the hard mask layer is etched. In an embodiment, a bottom surface of the first hard mask pattern and a bottom surface of the second hard mask pattern are coplanar with the top surface of the metal layer. In an embodiment, the hard mask layer of the substrate includes carbon. In an embodiment, the hard mask layer of the substrate is formed by a plasma enhanced chemical vapor deposition (PECVD) process.

In an embodiment, the anti-reflective coating pattern is separated from the assistant feature by the first spacer and the second spacer. In an embodiment, the anti-reflective coating pattern and the assistant feature comprise different materials. In an embodiment, the method further includes depositing a spacer layer covering a top surface of the hard mask layer, and a top surface and the opposite sidewalls of the anti-reflective coating pattern, and partially removing the spacer layer such that the first spacer and the second spacer are formed on the opposite sidewalls of the anti-reflective coating pattern.

In yet another embodiment of the present disclosure, a method for preparing a semiconductor device structure is provided. The method includes providing a substrate. The substrate includes a metal layer, an anti-reflective coating layer, and a hard mask layer sandwiched between the metal layer and the anti-reflective coating layer. The method also includes etching the anti-reflective coating layer to form a first anti-reflective coating pattern and a second anti-reflective coating pattern, and forming a first spacer and a second spacer on opposite sidewalls of the first anti-reflective coating pattern. The method further includes forming a third spacer and a fourth spacer on opposite sidewalls of the second anti-reflective coating pattern, and forming an assistant feature adjoining the first spacer, the second spacer, the third spacer, and the fourth spacer. In addition, the method includes removing the first anti-reflective coating pattern, the second anti-reflective coating pattern, and the assistant feature, and etching the hard mask layer by using the first spacer, the second spacer, the third spacer, and the fourth spacer as a mask, such that a first hard mask pattern, a second hard mask pattern, a third hard mask pattern, and a fourth hard mask pattern are formed.

In an embodiment, bottom surfaces of the first hard mask pattern, the second hard mask pattern, the third hard mask pattern, and the fourth hard mask pattern are coplanar. In an embodiment, the method further includes removing the first spacer, the second spacer, the third spacer, and the fourth spacer after the hard mask layer is etched. In an embodiment, a top surface of the hard mask layer is exposed by an opening between the first anti-reflective coating pattern and the second anti-reflective coating pattern before the first spacer, the second spacer, the third spacer, and the fourth spacer are formed. In an embodiment, the second spacer and the third spacer are formed in the opening, and a remaining portion of the opening is filled by the assistant feature.

Embodiments of a semiconductor device structure and method for preparing the same are provided in the disclosure. In some embodiments, the semiconductor device structure includes a first hard mask pattern and a second hard mask pattern disposed over a metal layer. In some embodiments, the first hard mask pattern and the second hard mask pattern are formed by a self-aligned double patterning (SADP) process, and the bottom surface of the first hard mask pattern is coplanar with the bottom surface of the second hard mask pattern. As a result, the feature size can be reduced without sacrificing the quality of the semiconductor device structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2 is a flow diagram illustrating a method for preparing a semiconductor device structure, in accordance with some embodiments.

DETAILED DESCRIPTION

Figure 1:
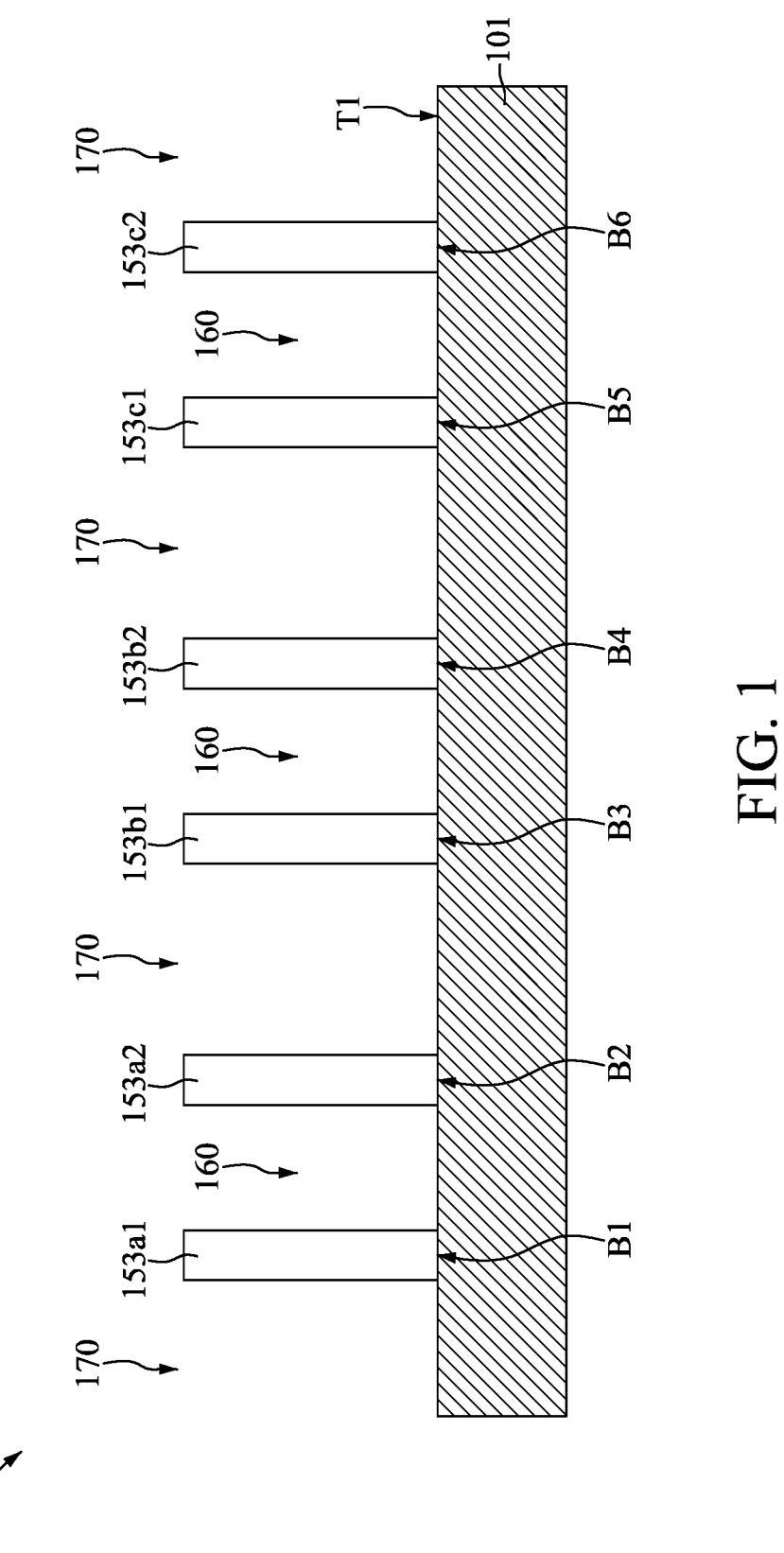
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes a metal layer 101, and a plurality of hard mask patterns 153a1, 153a2, 153b1, 153b2, 153c1, and 153c2 disposed over the metal layer 101, in accordance with some embodiments. In some embodiments, the hard mask patterns 153a1, 153a2, 153b1, 153b2, 153c1, and 153c2 are spaced apart from each other.

Moreover, each of the hard mask patterns 153a1, 153a2, 153b1, 153b2, 153c1, and 153c2 has a bottom surface, and the bottom surfaces of the hard mask patterns 153a1, 153a2, 153b1, 153b2, 153c1, and 153c2 are coplanar. For example, the bottom surface B1 of the hard mask pattern 153a1 is coplanar with the bottom surface B2 of the hard mask pattern 153a2, the bottom surface B3 of the hard mask pattern 153b1, the bottom surface B4 of the hard mask pattern 153b2, the bottom surface B5 of the hard mask pattern 153c1, and the bottom surface B6 of the hard mask pattern 153c2. In some embodiments, the metal layer 101 has a top surface T1, and the bottom surfaces B1, B2, B3, B4, B5, and B6 of the hard mask patterns 153a1, 153a2, 153b1, 153b2, 153c1, and 153c2 are coplanar and in direct contact with the top surface T1 of the metal layer 101.

In some embodiments, the top surface T1 of the metal layer 101 are partially exposed by a plurality of openings 160 and 170. In some embodiments, the hard mask patterns 153a1, 153a2, 153b1, 153b2, 153c1, and 153c2 are separated from each other by the openings 160 and 170. In addition, the materials of the hard mask patterns 153a1, 153a2, 153b1, 153b2, 153c1, and 153c2 are the same, in accordance with some embodiments. In some embodiments, the hard mask patterns 153a1, 153a2, 153b1, 153b2, 153c1, and 153c2 include carbon.

FIG. 2 is a flow diagram illustrating a method 10 for preparing a semiconductor device structure (e.g., the semiconductor device structure 100), and the method 10 includes steps S11, S13, S15, S17, S19, S21, S23 and S25, in accordance with some embodiments. The steps S11 to S25 of FIG. 2 are elaborated in connection with the following figures.

FIGS. 3 to 11 are cross-sectional views illustrating intermediate stages in the formation of the semiconductor device structure 100, in accordance with some embodiments.

Figure 3:
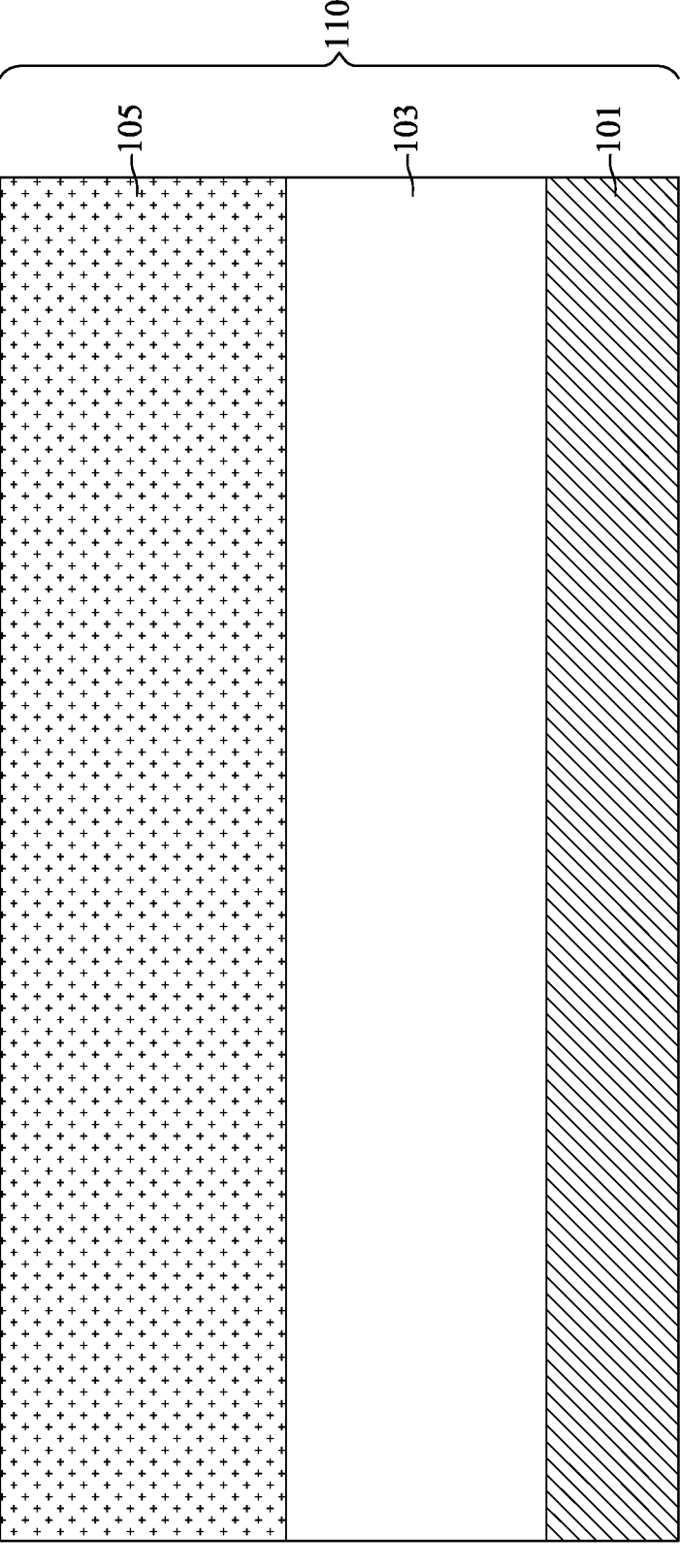
FIG. 3 is a cross-sectional view illustrating an intermediate stage of providing a substrate including a metal layer, a hard mask layer over the metal layer, and an anti-reflective coating layer over the hard mask layer during the formation of the semiconductor device structure, in accordance with some embodiments.

As shown in FIG. 3, a substrate 110 is provided, in accordance with some embodiments. In some embodiments, the substrate 110 includes a metal layer 101, a hard mask layer 103 over the metal layer 101, and an anti-reflective coating layer 105 over the hard mask layer 103. The respective step is illustrated as the step S11 in the method 10 shown in FIG. 2.

In some embodiments, the metal layer 101 includes copper (Cu), nickel (Ni), aluminum (Al), stainless steel, another suitable metal material, or a combination thereof. In some embodiments, the hard mask layer 103 includes carbon (C). In some embodiments, the hard mask layer 103 is formed over the metal layer 101 by performing a deposition process, such as a plasma enhanced chemical vapor deposition (PECVD) process.

In addition, the anti-reflective coating layer 105 is also referred to as a dielectric anti-reflective coating (DARC)

layer, and the anti-reflective coating layer 105 includes silicon oxide, silicon nitride, silicon oxynitride, silicon carbide, silicon oxycarbide, another suitable dielectric material, or a combination thereof. In some embodiments, the anti-reflective coating layer 105 and the hard mask layer 103 include different materials so that the etching selectivities may be different in the subsequent etching process.

Figure 4:
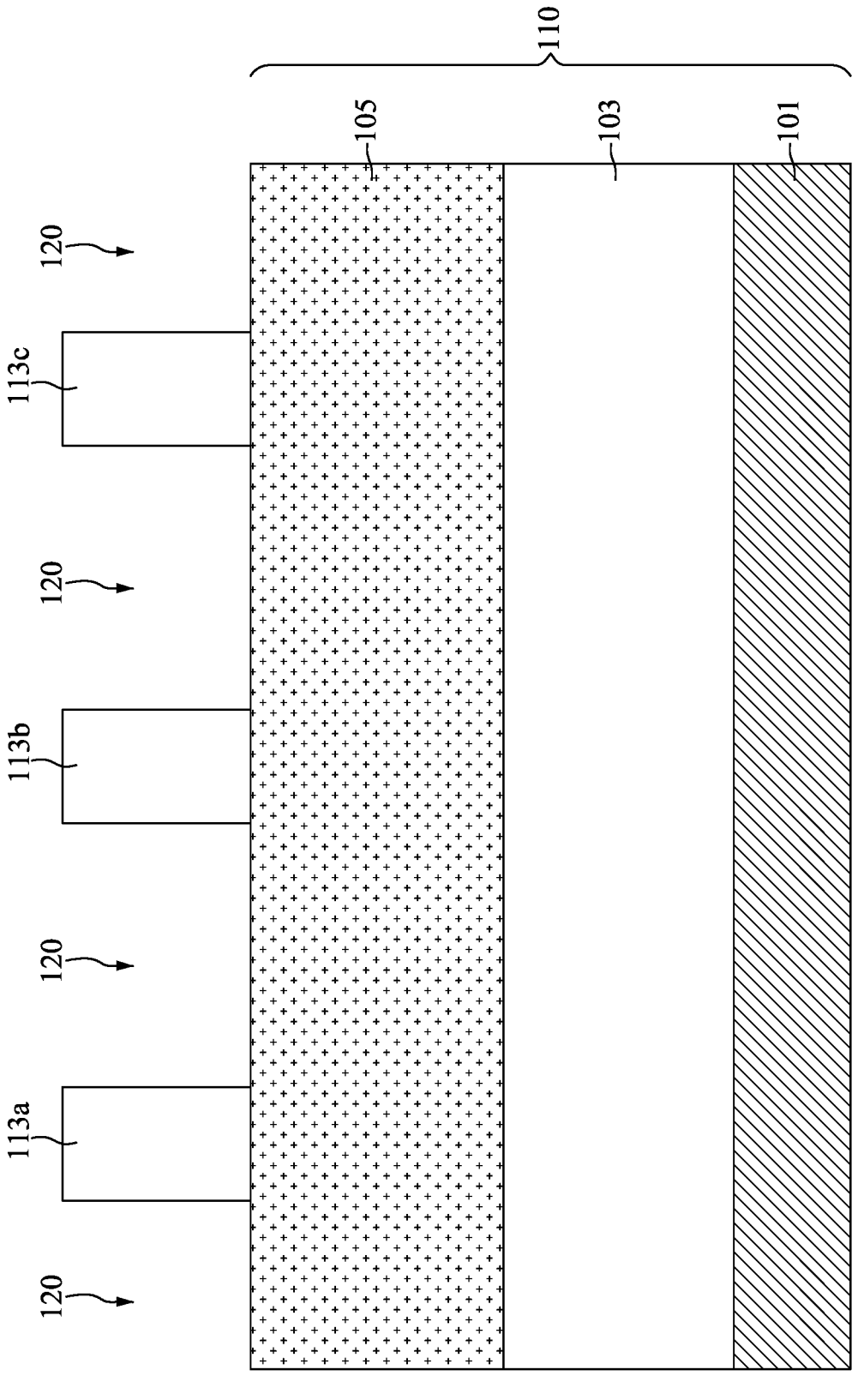
FIG. 4 is a cross-sectional view illustrating an intermediate stage of forming a patterned mask over the anti-reflective coating layer of the substrate during the formation of the semiconductor device structure, in accordance with some embodiments.

Next, a patterned mask is formed over the anti-reflective coating layer 105 of the substrate 110, as shown in FIG. 4 in accordance with some embodiments. In some embodiments, the patterned mask includes a plurality of patterns 113a, 113b, and 113c, and the anti-reflective coating layer 105 is partially exposed by openings 120 between the patterns 113a, 113b, and 113c. In some embodiments, the patterned mask includes a patterned photoresist layer formed by a lithography process, and the patterned mask includes a photoresist material, or any photo-patternable material.

Figure 5:
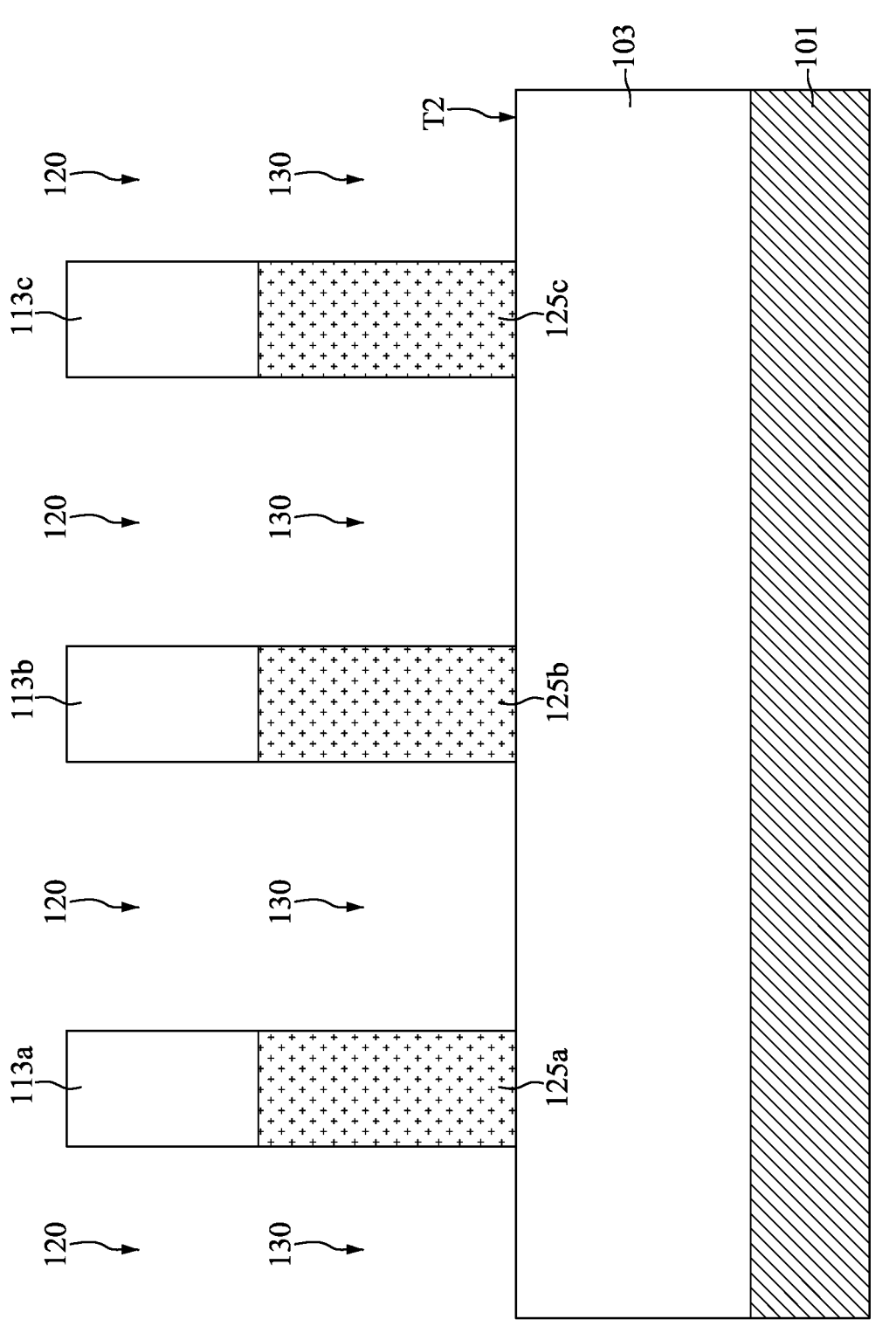
FIG. 5 is a cross-sectional view illustrating an intermediate stage of etching the anti-reflective coating layer by using the patterned mask as a mask to form a plurality of anti-reflective coating patterns during the formation of the semiconductor device structure, in accordance with some embodiments.

Subsequently, the anti-reflective coating layer 105 is etched to form a plurality of anti-reflective coating patterns 125a, 125b, and 125c, as shown in FIG. 5 in accordance with some embodiments. The respective step is illustrated as the step S13 in the method 10 shown in FIG. 2. In some embodiments, the anti-reflective coating layer 105 is etched by a wet etching process, a dry etching process, or a combination thereof.

In some embodiments, the anti-reflective coating patterns 125a, 125b, and 125c are spaced apart from each other. In some embodiments, the patterns 113a, 113b, and 113c of the patterned mask are transferred to the underlying anti-reflective coating layer 105 (see FIG. 4), and a plurality of openings 130 are formed penetrating through the anti-reflective coating layer 105. As a result, the top surface T2 of the hard mask layer 103 is partially exposed by the openings 130 between the anti-reflective coating patterns 125a, 125b, and 125c.

Figure 6:
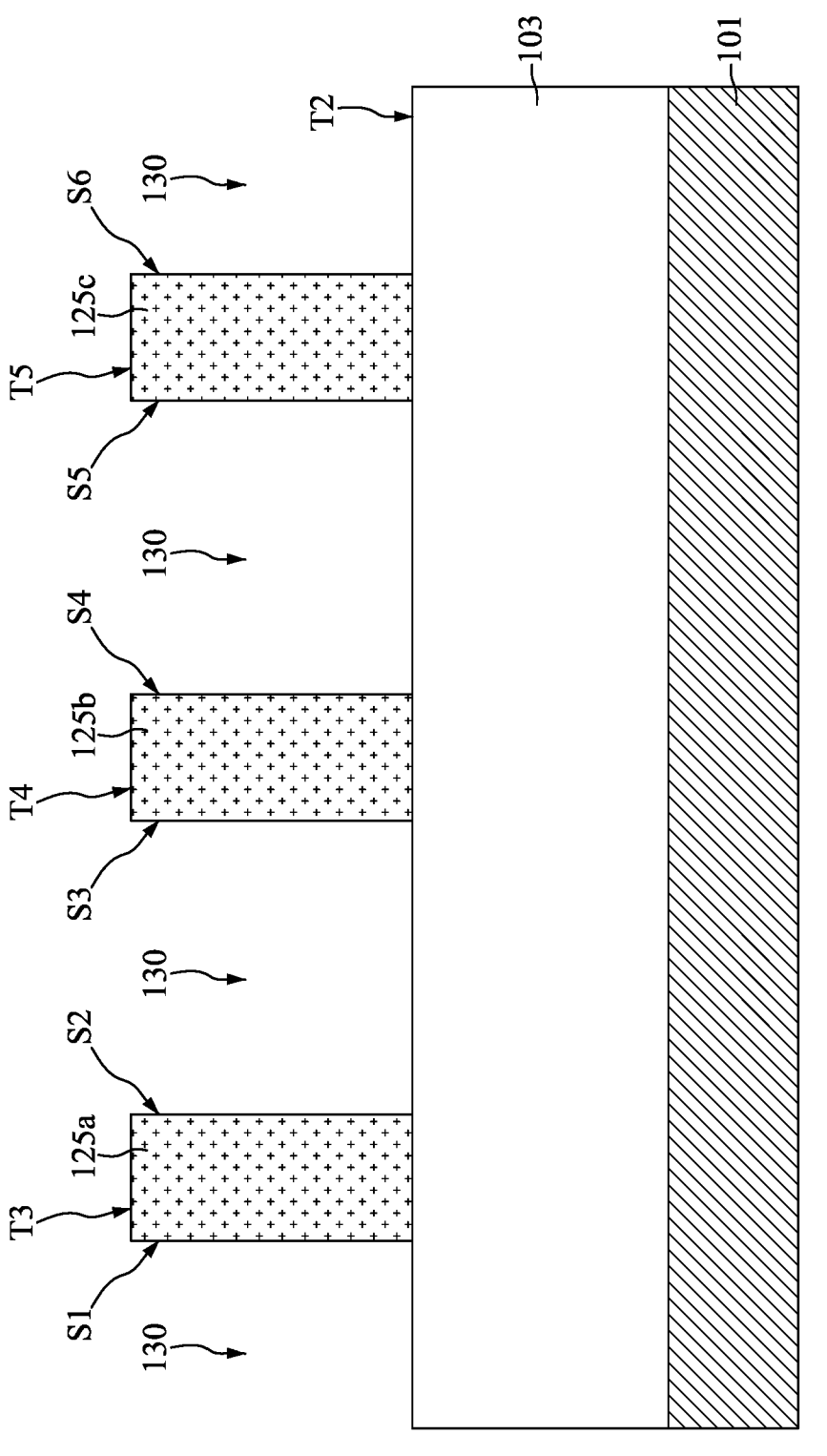
FIG. 6 is a cross-sectional view illustrating an intermediate stage of removing the patterned mask over the anti-reflective coating patterns during the formation of the semiconductor device structure, in accordance with some embodiments.

Then, the patterned mask including the patterns 113a, 113b, and 113c is removed, as shown in FIG. 6 in accordance with some embodiments. In some embodiments, the patterned mask having the patterns 113a, 113b, and 113c is removed by a stripping process, an ashing process, an etching process, or another suitable process.

Moreover, top surfaces and opposite sidewalls of each of the anti-reflective coating patterns 125a, 125b, and 125c are exposed after the patterned mask is removed. As shown in FIG. 6, the top surface T3 and the opposite sidewalls S1 and S2 of the anti-reflective coating pattern 125a, the top surface T4 and the opposite sidewalls S3 and S4 of the anti-reflective coating pattern 125b, and the top surface T5 and the opposite sidewalls S5 and S6 of the anti-reflective coating pattern 125c are exposed, in accordance with some embodiments.

Figure 7:
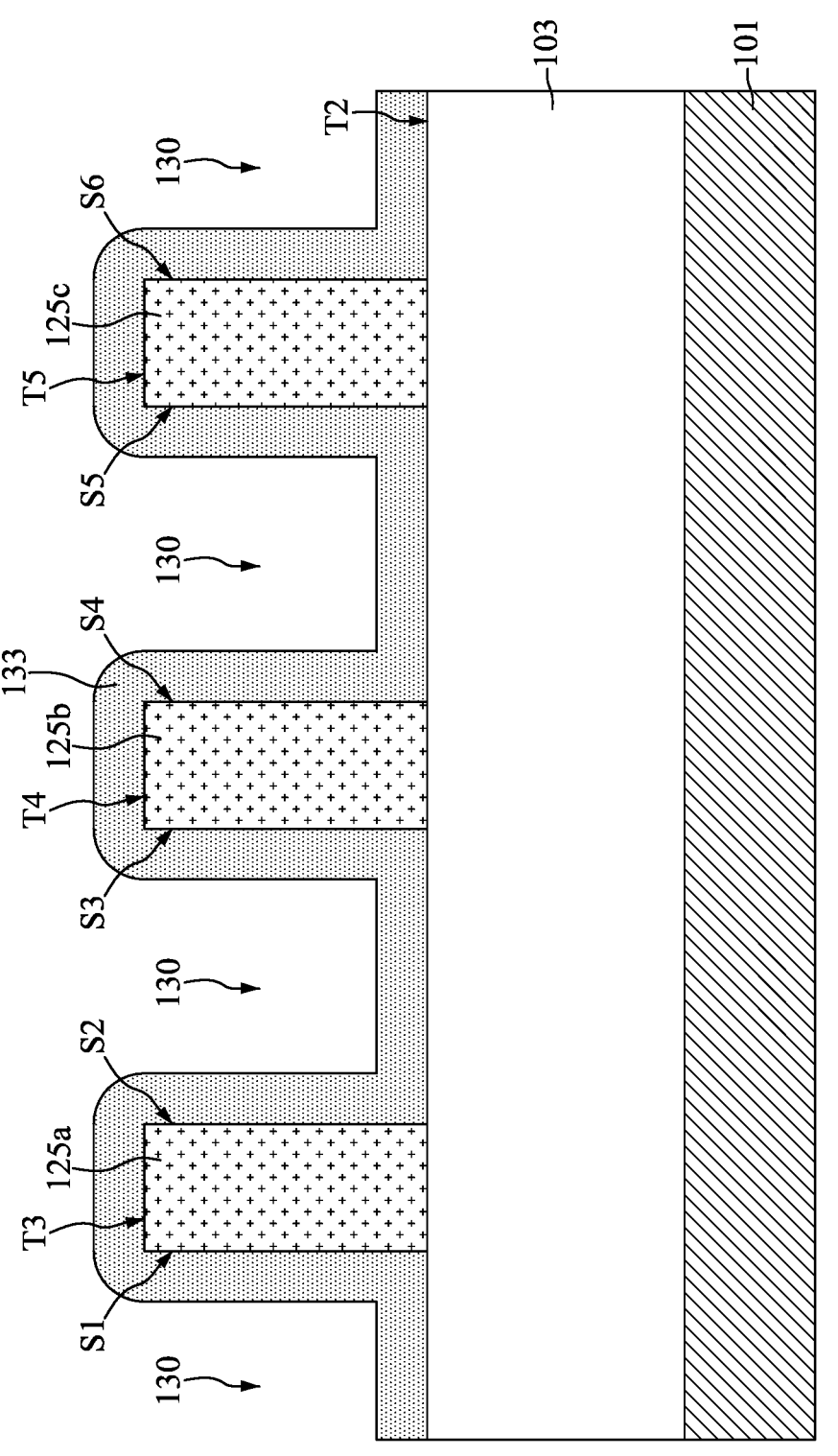
FIG. 7 is a cross-sectional view illustrating an intermediate stage of depositing a spacer layer covering the hard mask layer and the anti-reflective coating patterns during the formation of the semiconductor device structure, in accordance with some embodiments.

Next, a spacer layer 133 is conformally deposited over the structure of FIG. 6, as shown in FIG. 7 in accordance with some embodiments. In some embodiments, the spacer layer 133 covers the exposed portions of the top surface T2 of the hard mask layer 103. In some embodiments, the spacer layer 133 extends to cover the top surfaces T3, T4, T5 and the opposite sidewalls S1, S2, S3, S4, S5, S6 of the anti-reflective coating patterns 125a, 125b, and 125c. The respective step is illustrated as the step S15 in the method 10 shown in FIG. 2.

In some embodiments, the spacer layer 133 includes a dielectric material, such as silicon oxide, silicon nitride, silicon oxynitride, or another suitable dielectric material. In some embodiments, the spacer layer 133 is formed by a deposition process, such as a chemical vapor deposition (CVD) process, a physical vapor deposition (PVD) process, an atomic layer deposition (ALD) process, or another suitable method. In some embodiments, a material of the spacer layer 133 is different from the materials of the anti-reflective coating patterns 125a, 125b, 125c and the hard mask layer 103 so that the etching selectivities may be different in the subsequent etching process.

Figure 8:
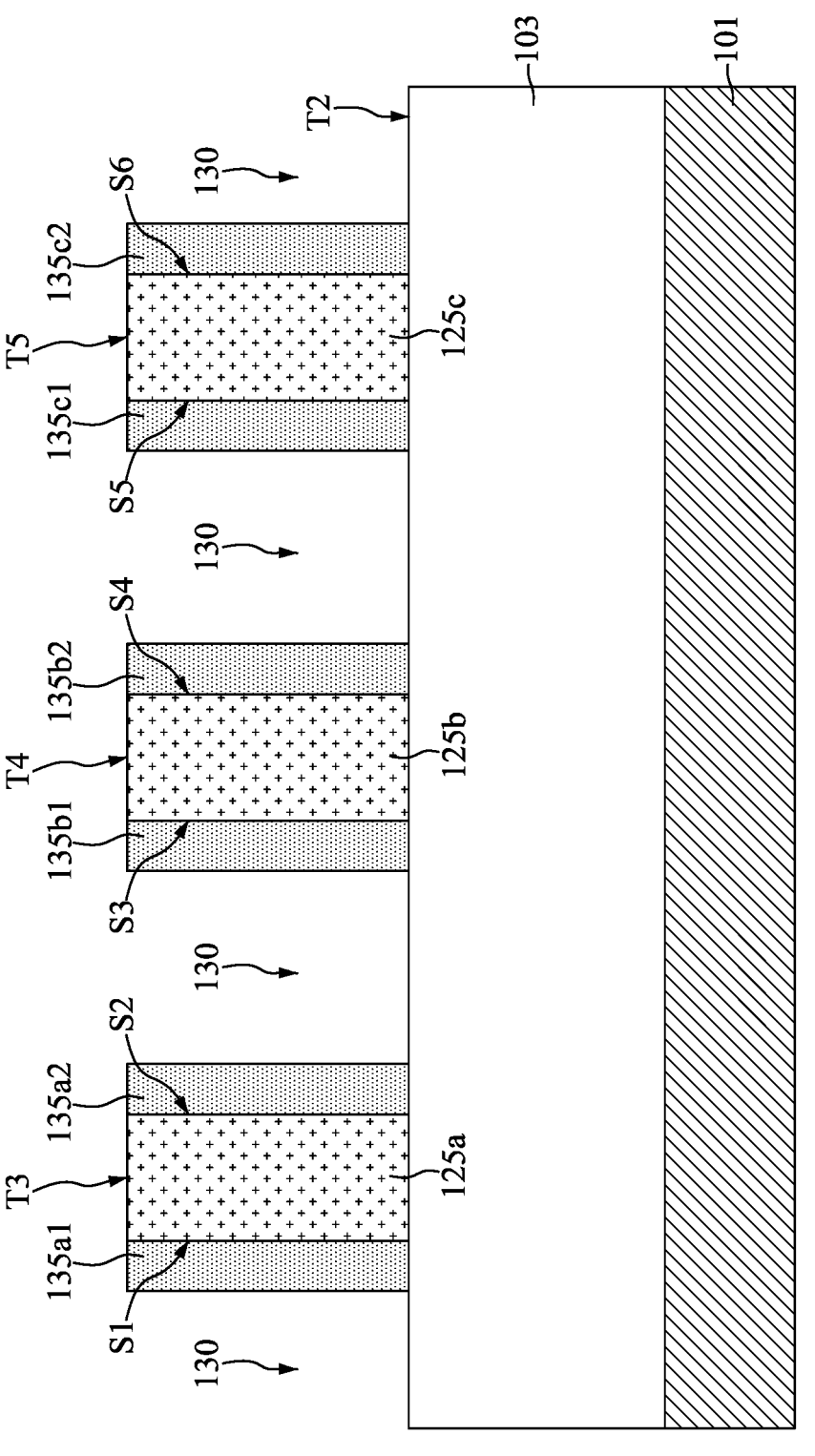
FIG. 8 is a cross-sectional view illustrating an intermediate stage of partially removing the spacer layer to form a plurality of spacers on opposite sidewalls of the anti-reflective coating patterns during the formation of the semiconductor device structure, in accordance with some embodiments.

Subsequently, the spacer layer 133 is partially removed by an etching process to form a plurality of spacers 135a1, 135a2, 135b1, 135b2, 135c1, and 135c2, as shown in FIG. 8 in accordance with some embodiments. In some embodiments, the spacer layer 133 is etched by an anisotropic etching process, which removes the same amount of the spacer material vertically in all places, leaving the spacers 135a1 and 135a2 on the opposite sidewalls S1 and S2 of the anti-reflective coating pattern 125a, leaving the spacers 135b1 and 135b2 on the opposite sidewalls S3 and S4 of the anti-reflective coating pattern 125b, and leaving the spacers 135c1 and 135c2 on the opposite sidewalls S5 and S6 of the anti-reflective coating pattern 125c.

In some embodiments, the etching process is a dry etching process. The respective step is illustrated as the step S17 in the method shown in FIG. 2. After the etching process is performed, the top surface T2 of the hard mask layer 103 is partially exposed by the openings 130, the top surfaces T3, T4, and T5 of the anti-reflective coating patterns 125a, 125b, and 125c are exposed, while the sidewalls S1, S2, S3, S4, S5, and S6 of the anti-reflective coating patterns 125a, 125b, and 125c are covered.

Figure 9:
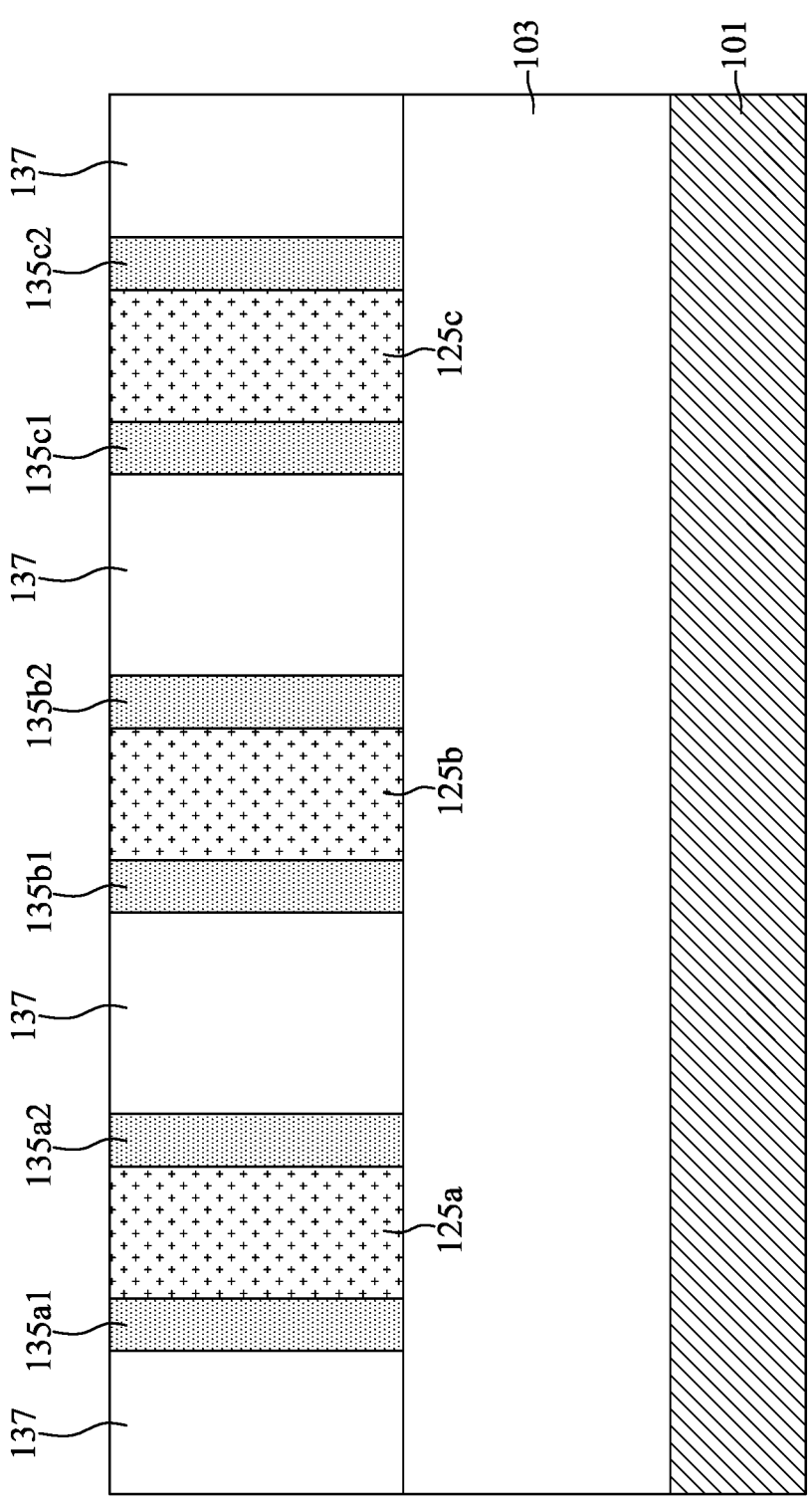
FIG. 9 is a cross-sectional view illustrating an intermediate stage of forming an assistant feature adjoining the spacers and over the hard mask layer during the formation of the semiconductor device structure, in accordance with some embodiments.

Then, an assistant feature 137 is formed adjoining the spacers 135a1, 135a2, 135b1, 135b2, 135c1, and 135c2 and over the hard mask layer 103, as shown in FIG. 9 in accordance with some embodiments. The respective step is illustrated as the step S19 in the method 10 shown in FIG. 2. In other words, the assistant feature 137 is formed surrounding the spacers 135a1, 135a2, 135b1, 135b2, 135c1, 135c2, and the anti-reflective coating patterns 125a, 125b, 125c, in accordance with some embodiments.

In some embodiments, the assistant feature 137 is in direct contact with the top surface T2 of the hard mask layer 103, and the assistant feature 137 is in direct contact with the spacers 135a1, 135a2, 135b1, 135b2, 135c1, and 135c2. In some embodiments, the anti-reflective coating pattern 125a is separated from the assistant feature 137 by the spacers 135a1 and 135a2, the anti-reflective coating pattern 125b is separated from the assistant feature 137 by the spacers 135b1 and 135b2, and the anti-reflective coating pattern 125c is separated from the assistant feature 137 by the spacers 135c1 and 135c2.

In some embodiments, the assistant feature 137 includes a material different from the materials of the spacers 135a1, 135a2, 135b1, 135b2, 135c1, 135c2, and the hard mask layer 103, so that the etching selectivities may be different in the subsequent etching process. In some embodiments, the material of the assistant feature 137 is different form the material of the anti-reflective coating patterns 125a, 125b, 125c.

Moreover, in some embodiments, the assistant feature 137 is formed by a deposition process and a subsequent planarization process. The deposition process includes a CVD process, a PVD process, an ALD process, a spin-on coating process, or another suitable deposition process. The planarization process may include a chemical mechanical polishing (CMP) process. After the planarization process, the top surface of the assistant feature 137 is coplanar with the top surfaces of the spacers 135a1, 135a2, 135b1, 135b2, 135c1, 135c2, and the anti-reflective coating patterns 125a, 125b, 125c.

Figure 10:
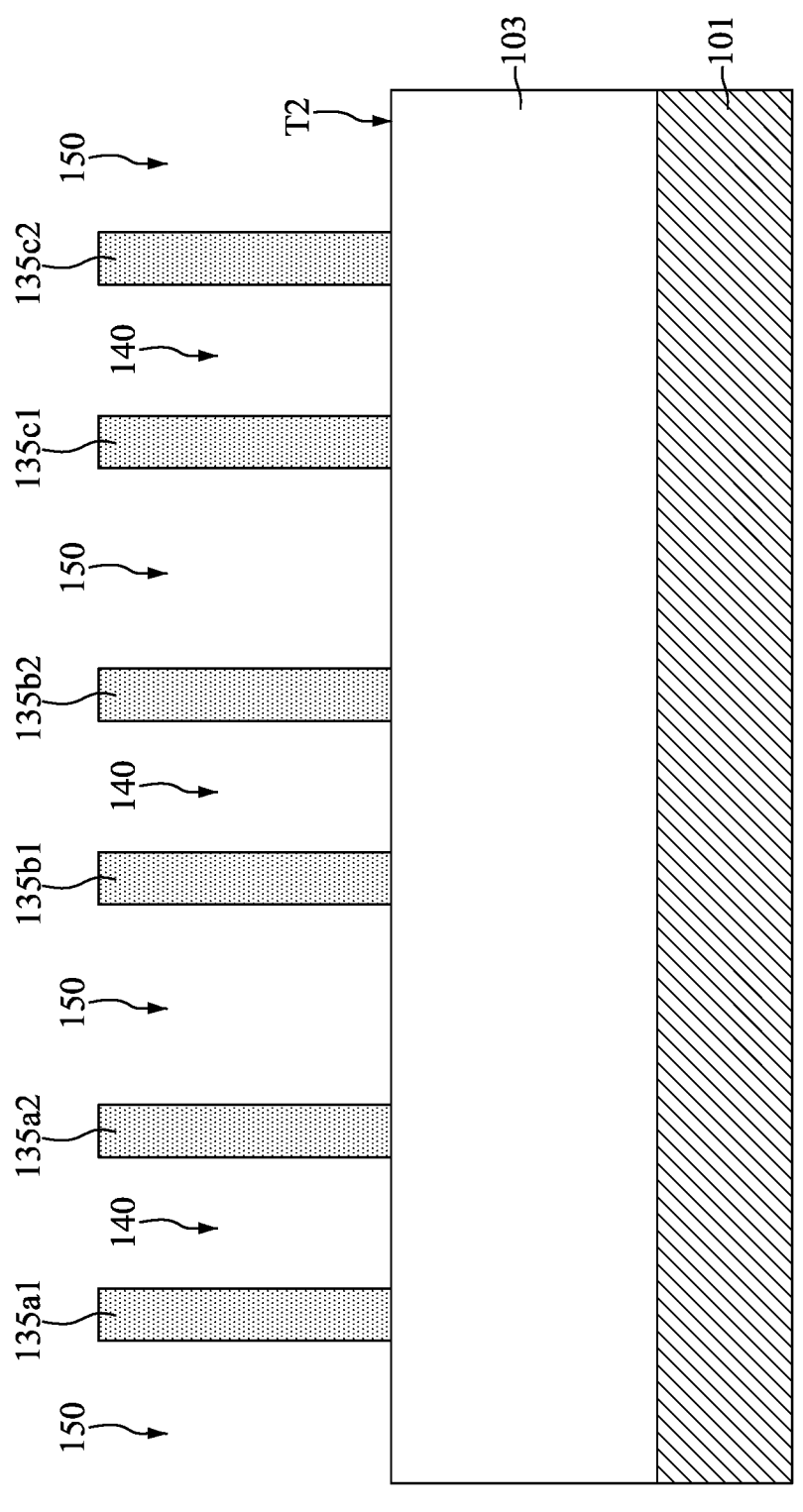
FIG. 10 is a cross-sectional view illustrating an intermediate stage of removing the anti-reflective coating patterns and the assistant feature during the formation of the semiconductor device structure, in accordance with some embodiments.

Next, the anti-reflective coating patterns 125a, 125b, 125c and the assistant feature 137 are removed, as shown in FIG. 10 in accordance with some embodiments. The respective step is illustrated as the step S21 in the method 10 shown in FIG. 2. In some embodiments, the anti-reflective coating patterns 125a, 125b, 125c and the assistant feature 137 are removed by an etching process.

In some embodiments, the anti-reflective coating patterns 125a, 125b, 125c are removed to form a plurality of openings 140, and the assistant feature 137 is removed to form a plurality of openings 150, as shown in FIG. 10. Although the openings 150 are separated from each other in the cross-sectional view of FIG. 10, the openings 150 may be physically connected in other cross-sectional views. In some embodiments, the top surface T2 of the hard mask layer 103 is partially exposed by the openings 140 and 150.

In some embodiments, the etching process is designed to selectively remove the anti-reflective coating patterns 125a, 125b, 125c and the assistant feature 137 while leaving the spacers 135a1, 135a2, 135b1, 135b2, 135c1, 135c2 substantially intact. Within the context of this disclosure, the word "substantially" means preferably at least 90%, more preferably 95%, even more preferably 98%, and most preferably 99%. Such an etching process may be a wet etching process, a dry etching process, or a combination thereof.

Figure 11:
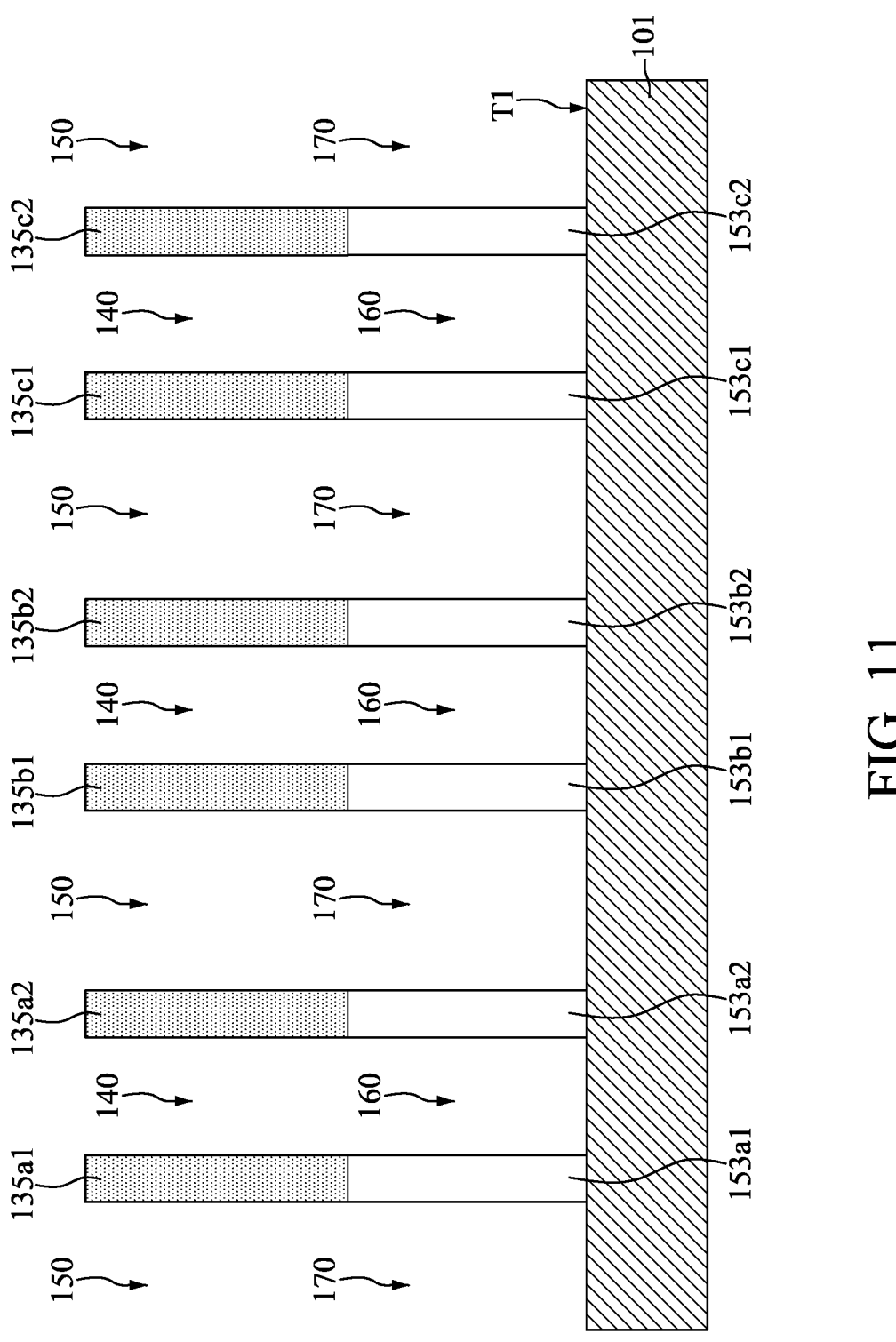
FIG. 11 is a cross-sectional view illustrating an intermediate stage of etching the hard mask layer by using the spacers as a mask to form a plurality of hard mask patterns during the formation of the semiconductor device structure, in accordance with some other embodiments.

Subsequently, the hard mask layer 103 is etched by using the spacers 135a1, 135a2, 135b1, 135b2, 135c1, and 135c2 as a mask to form a plurality of hard mask patterns 153a1, 153a2, 153b1, 153b2, 153c1, and 153c2, as shown in FIG. 11 in accordance with some embodiments. The respective step is illustrated as the step S23 in the method 10 shown in FIG. 2. In some embodiments, the hard mask layer 103 is etched by a wet etching process, a dry etching process, or a combination thereof.

In some embodiments, the hard mask patterns 153a1, 153a2, 153b1, 153b2, 153c1, and 153c2 are spaced apart from each other. In some embodiments, the patterns of the spacers 135a1, 135a2, 135b1, 135b2, 135c1, and 135c2 are transferred to the underlying hard mask layer 103 (see FIG. 10), and a plurality of openings 160 and 170 are formed penetrating through the hard mask layer 103 (The openings 160 are located under the openings 140, and the openings 170 are located under the openings 150). As a result, the top surface T1 of the metal layer 101 is partially exposed by the openings 160 and 170 between the hard mask patterns 153a1, 153a2, 153b1, 153b2, 153c1, and 153c2. In addition, the sidewalls of the openings 160 are substantially aligned with the sidewalls of the openings 140, and the sidewalls of the openings 170 are substantially aligned with the sidewalls of the openings 150, in accordance with some embodiments.

Then, the spacers 135a1, 135a2, 135b1, 135b2, 135c1, and 135c2 are removed, leaving the hard mask patterns 153a1, 153a2, 153b1, 153b2, 153c1, and 153c2 over the metal layer 101, as shown in FIG. 1 in accordance with some embodiments. The respective step is illustrated as the step S25 in the method 10 shown in FIG. 2. In some embodiments, the spacers 135a1, 135a2, 135b1, 135b2, 135c1, and 135c2 are removed by a stripping process, an ashing process, an etching process, or another suitable process.

After the spacers 135a1, 135a2, 135b1, 135b2, 135c1, and 135c2 are removed, the semiconductor device structure 100 is obtained. As mentioned above, the bottom surfaces B1, B1, B2, B3, B4, B5, and B6 of the hard mask patterns 153a1, 153a2, 153b1, 153b2, 153c1, and 153c2 are coplanar and in direct contact with the top surface T1 of the metal layer 101.

Embodiments of the semiconductor device structure and method for preparing the same are provided in the disclosure. In some embodiments, the semiconductor device structure includes a first hard mask pattern (e.g., the hard mask pattern 153a1) and a second hard mask pattern (e.g., the hard mask pattern 153a2) disposed over a metal layer (e.g., the metal layer 101). In some embodiments, the first hard mask pattern and the second hard mask pattern are formed by a self-aligned double patterning (SADP) process, and the bottom surface of the first hard mask pattern is coplanar with the bottom surface of the second hard mask pattern. For example, the bottom surface B1 of the hard mask pattern 153a1 is coplanar with the bottom surface B2 of the hard mask pattern 153a2. Moreover, the bottom surfaces B1 and B2 of the hard mask patterns 153a1 and 153a2 are coplanar with the top surface T1 of the metal layer 101. As a result, the feature size can be reduced without sacrificing the quality of the semiconductor device structure.

In one embodiment of the present disclosure, a semiconductor device structure is provided. The semiconductor device structure includes a first hard mask pattern disposed over a metal layer. The semiconductor device structure also includes a second hard mask pattern disposed over the metal layer and spaced apart from the first hard mask pattern. A bottom surface of the first hard mask pattern is coplanar with a bottom surface of the second hard mask pattern.

In another embodiment of the present disclosure, a method for preparing a semiconductor device structure is provided. The method includes providing a substrate. The substrate includes a metal layer, a hard mask layer over the metal layer, and an anti-reflective coating layer over the hard mask layer. The method also includes etching the anti-reflective coating layer to form an anti-reflective coating pattern, and forming a first spacer and a second spacer on opposite sidewalls of the anti-reflective coating pattern. The method further includes forming an assistant feature adjoining the first spacer and the second spacer and over the hard mask layer, and removing the anti-reflective coating pattern and the assistant feature. In addition, the method includes etching the hard mask layer by using the first spacer and the second spacer as a mask to form a first hard mask pattern and a second hard mask pattern.

In yet another embodiment of the present disclosure, a method for preparing a semiconductor device structure is provided. The method includes providing a substrate. The substrate includes a metal layer, an anti-reflective coating layer, and a hard mask layer sandwiched between the metal layer and the anti-reflective coating layer. The method also includes etching the anti-reflective coating layer to form a first anti-reflective coating pattern and a second anti-reflective coating pattern, and forming a first spacer and a second spacer on opposite sidewalls of the first anti-reflective coating pattern. The method further includes forming a third spacer and a fourth spacer on opposite sidewalls of the second anti-reflective coating pattern, and forming an assistant feature adjoining the first spacer, the second spacer, the third spacer, and the fourth spacer. In addition, the method includes removing the first anti-reflective coating pattern, the second anti-reflective coating pattern, and the assistant feature, and etching the hard mask layer by using the first spacer, the second spacer, the third spacer, and the fourth spacer as a mask, such that a first hard mask pattern, a second hard mask pattern, a third hard mask pattern, and a fourth hard mask pattern are formed.

The embodiments of the present disclosure have some advantageous features. In some embodiments, the semiconductor device structure includes a plurality of hard mask patterns disposed over a metal layer. In some embodiments, the hard mask patterns are formed by a self-aligned double patterning (SADP) process, and the bottom surfaces of the hard mask patterns are coplanar. As a result, the feature size can be reduced without sacrificing the quality of the semiconductor device structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:

providing a substrate, wherein the substrate comprises a metal layer, a hard mask layer over the metal layer, and an anti-reflective coating layer over the hard mask layer, wherein the metal layer is made of metal selected from a group consisting of copper (Cu), nickel (Ni), and stainless steel;

etching the anti-reflective coating layer to form an anti-reflective coating pattern;

depositing a spacer layer covering a top surface of the hard mask layer, and a top surface and the opposite sidewalls of the anti-reflective coating pattern;

removing a first portion of the spacer layer on the top surface of the hard mask layer and a second portion of the spacer layer on the top surface of the anti-reflective coating pattern to a first spacer and a second spacer on opposite sidewalls of the anti-reflective coating pattern, wherein a top surface of the anti-reflective coating pattern is coplanar with a top surface of the first spacer and a top surface of the second spacer;

forming an assistant feature adjoining the first spacer and the second spacer and over the hard mask layer;

removing the anti-reflective coating pattern and the assistant feature; and etching the hard mask layer by using the first spacer and the second spacer as a mask to form a first hard mask pattern and a second hard mask pattern;

wherein a top surface of the metal layer is exposed by an opening between the first hard mask pattern and the second hard mask pattern after the hard mask layer is etched;

wherein a bottom surface of the first hard mask pattern and a bottom surface of the second hard mask pattern are coplanar with the top surface of the metal layer;

wherein the assistant feature is not formed above the top surface of the anti-reflective coating pattern after the first spacer and the second spacer are formed.

2. The method for preparing a semiconductor device structure of claim 1, wherein the hard mask layer of the substrate includes carbon.

3. The method for preparing a semiconductor device structure of claim 1, wherein the hard mask layer of the substrate is formed by a plasma enhanced chemical vapor deposition (PECVD) process.

4. The method for preparing a semiconductor device structure of claim 1, wherein the anti-reflective coating pattern is separated from the assistant feature by the first spacer and the second spacer.

5. The method for preparing a semiconductor device structure of claim 1, wherein the anti-reflective coating pattern and the assistant feature comprise different materials.

* * * * *